United States Patent
Jones (12) United States Patent Jones (10) Patent No.: US 7,342,450 B2
(45) Date of Patent: Mar. 11, 2008

(54) SLEW RATE ENHANCEMENT CIRCUITRY FOR FOLDED CASCODE AMPLIFIER

(75) Inventor: Mark A. Jones, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 11/401,492

(22) Filed: Apr. 11, 2006

(65) Prior Publication Data

US 2006/0181350 A1 Aug. 17, 2006

Related U.S. Application Data

(62) Division of application No. 10/878,849, filed on Jun. 28, 2004.

(51) Int. Cl.
*H03F 3/45* (2006.01)
(52) U.S. Cl. ............... 330/253; 330/260; 330/261; 327/561
(58) Field of Classification Search ............. 330/253, 330/260, 261, 285, 311, 296, 133; 327/560, 327/561, 309, 209
See application file for complete search history.

(56) References Cited

U.S. PATENT DOCUMENTS 5,446,412 A * 8/1995 Kimyacioglu et al. ...... 330/255

* cited by examiner

*Primary Examiner*—David Nelms
*Assistant Examiner*—David Chung
(74) *Attorney, Agent, or Firm*—Wade James Brady, III; Frederick J. Telecky, Jr.

(57) ABSTRACT

A folded-cascode operational amplifier including a differential input stage (19) and a class AB output stage (20) includes a first slew boost current mirror (13) and a second slew boost current mirror (14) having inputs connected to drains of the input transistors, respectively. Each current mirror amplifies excess tail current steered into it as a result of a large, rapid input signal transition. The amplified excess tail current is used to boost the slew rate of the class AB output stage in accordance with a first polarity of the difference between the first (Vin+) and second (Vin−) input voltages. The drains of the input transistors are maintained at a voltage less than a transistor threshold voltage above the ground except during slewing operation of the operational amplifier to effectively isolate the current mirrors except during slewing operation.

12 Claims, 6 Drawing Sheets

SLEW RATE ENHANCEMENT CIRCUITRY FOR FOLDED CASCODE AMPLIFIER

This application is a division of Ser. No. 10/878,849, filed Jun. 28, 2004.

BACKGROUND OF THE INVENTION

The present invention relates generally to improving the slew rate of a folded cascode amplifier while also maintaining low noise operation.

The "slew rate" of an amplifier is a measure of how fast the amplifier can charge up a large capacitor that is connected to an output conductor of the amplifier in response to a large, rapid increase or decrease (such as a step function increase or decrease) of the input voltage applied to the amplifier. (More generally, the slew rate is a measure of the maximum rate of change of the output voltage in response to an input step function, and is normally, but not necessarily, limited by charging the compensation capacitors.) A high slew rate generally is a desirable characteristic of an amplifier, especially an operational amplifier, and especially a high-speed CMOS operational amplifier.

One technique for increasing the slew rate of an amplifier is to increase the bias current of the input stage, but that has a tendency to increase the bandwidth of the amplifier and leads to a need to increase the compensation capacitance of the amplifier to improve circuit stability, which tends to decrease the slew rate. Moreover, in the folded cascode amplifier, increasing the input stage bias current requires a commensurate increase in the second stage current (to avoid turning the second stage off, which in turn adds to the total input referred noise.

Providing both a high slew rate and a low noise level in a two stage folded cascode amplifier puts conflicting constraints on bias currents of the input stage and the second stage of the amplifier, because keeping the second stage noise contributions low generally requires keeping the operating bias currents low in the second stage. However, that ordinarily results in a low slew rate of the two stage folded cascode amplifier.

There is a very large market for improved, low-cost operational amplifiers with high slew rate capability. Although there are many operational amplifier designs capable of providing high slew rates, they unfortunately have various problems, including high noise generation, high power dissipation, ineffective operation at low power supply voltages, poorly controlled operational parameters over a range of power supply voltages, and/or redundant circuitry.

The closest prior art is believed to include commonly assigned U.S. Pat. No. 6,359,512 entitled "Slew Rate Boost Circuitry and Method" issued Mar. 19, 2002 to Ivanov et al. and commonly assigned U.S. Pat. No. 6,437,645 entitled "Slew Rate Boost Circuitry and Method" issued Aug. 20, 2002 to Ivanov et al., both of which relate to boosting slew rates of differential amplifiers and operational amplifiers. The closest prior art is believed to also include U.S. Pat. No. 4,570,128 entitled "Class AB Output Circuit with Large Swing" issued Feb. 11, 1986 to Monticelli, which discloses details of a class AB output circuit which can be used in conjunction with the present invention.

Figure 1:
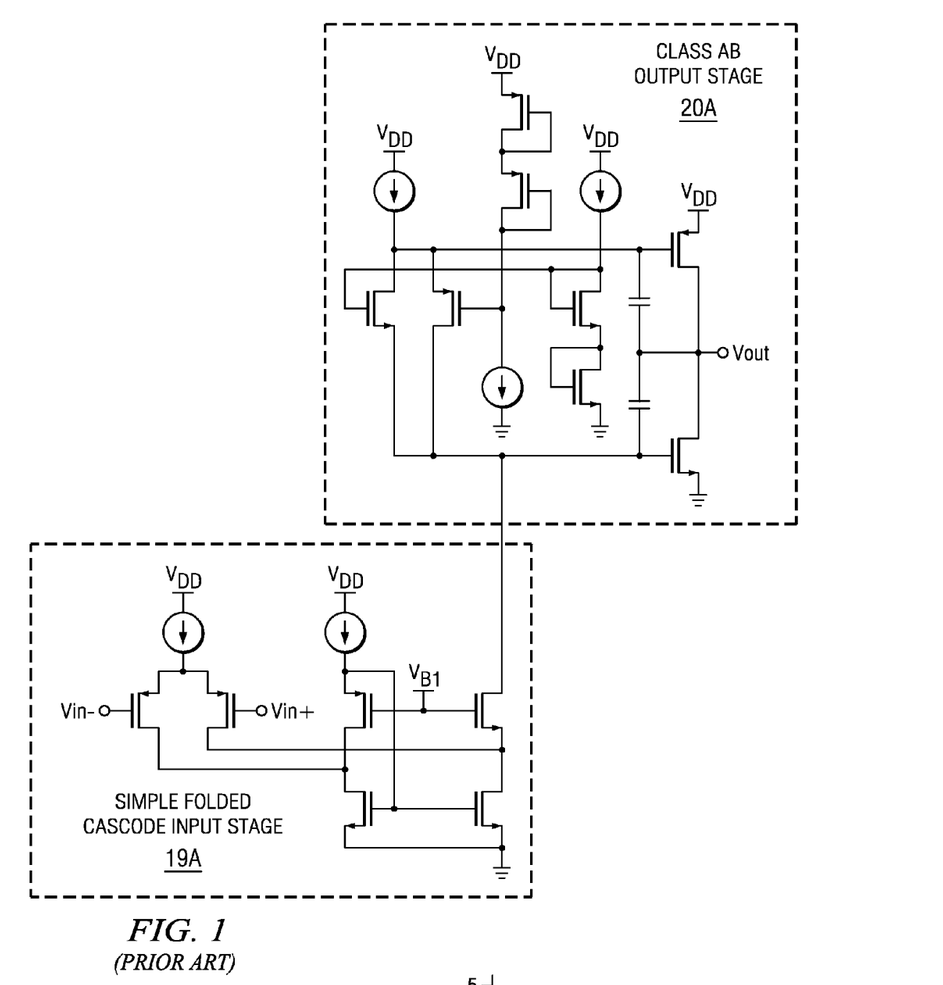
FIG. 1 is a schematic diagram of a prior art operational amplifier having a simple folded cascode input stage driving a class AB output stage
Figure 2:
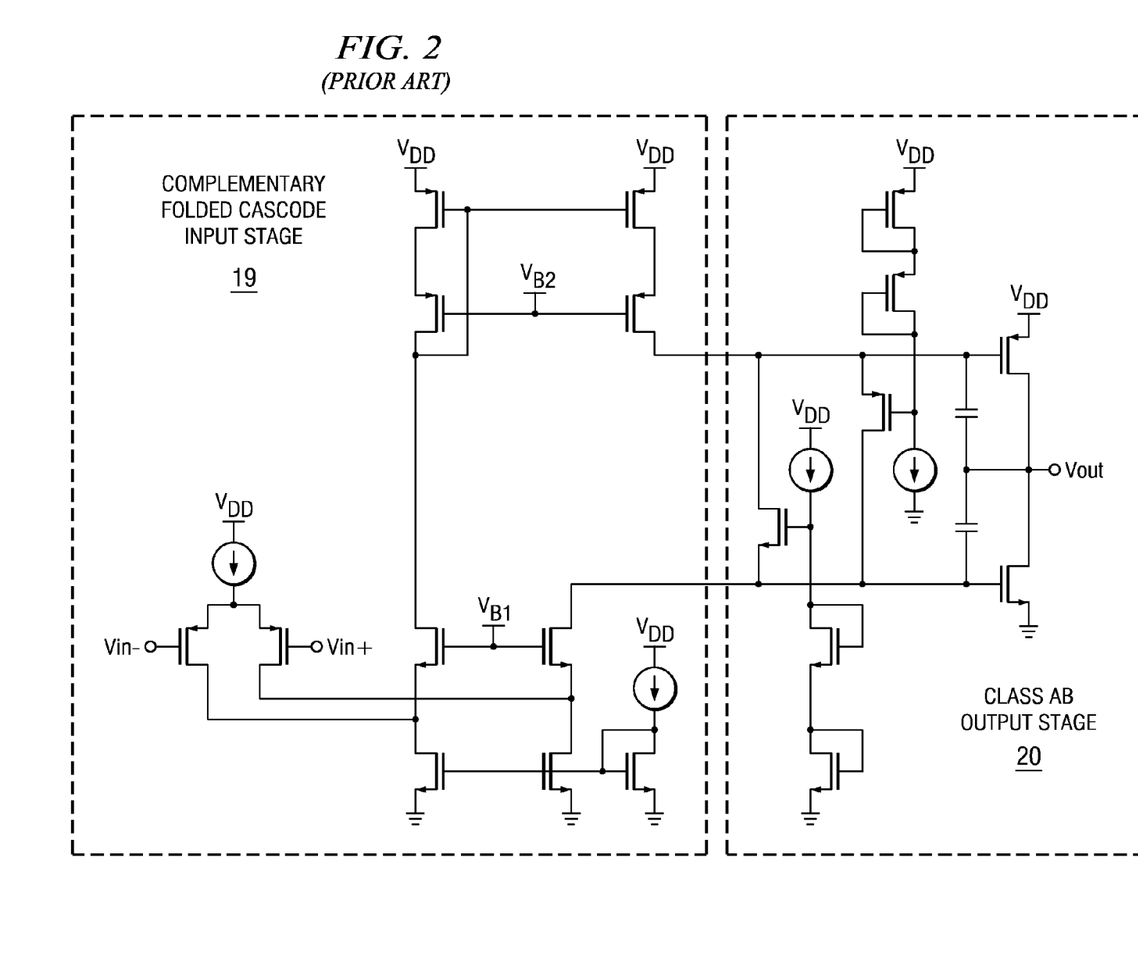
FIG. 2 is a schematic diagram of a prior art operational amplifier having a complementary folded cascode input stage driving a class AB output stage.

FIG. 1 is a schematic diagram of an operational amplifier including a conventional simple folded cascode input stage 19A which drives a class AB output stage 20A similar to the one described in the above-mentioned Monticelli U.S. Pat. No. 4,570,128. FIG. 2 is a schematic diagram of another operational amplifier including a conventional complementary folded cascode input stage 19 which drives a class AB output stage 20 that is slightly different than class AB output stage 20A shown in FIG. 1.

Thus, there is an unmet need for a low cost, low noise amplifier having a high slew rate.

There also is an unmet need for a low cost, low noise amplifier having the ability to increase the slew rate of various already existing amplifier designs without altering the signal path architecture and without adding additional quiescent power consumption.

SUMMARY OF THE INVENTION

It is an object of the present invention to provide a low cost, low noise amplifier having a high slew rate.

It is another object of the invention to provide a low cost, low noise amplifier having the ability to increase the slew rate of various already existing amplifier designs without altering the signal path architecture and without adding additional quiescent power consumption.

Briefly described, and in accordance with one embodiment, the present invention increases a slew rate of a folded-cascode operational amplifier by applying a large, rapid transition of an input signal between the bases of a first input transistor having a gate coupled to a first input voltage (Vin+), and emitter coupled to a tail current source (15), and a collector (12) coupled to a collector of a first current source transistor and an emitter of a first cascode transistor and a second input transistor having a base coupled to a second input voltage (Vin−), and emitter coupled to the tail current source (15), and a collector (11) coupled to a collector of a second current source transistor and an emitter of a second cascode transistor and amplifying an excess of tail current steered by the first input transistor into the input of a first slew boost circuit (13) over a current flowing in a first current source transistor and applying the amplified excess current to boost the slew rate of a class AB output stage in accordance with a first polarity of the difference between the first (Vin+) and second (Vin−) input voltages.

In one described embodiment, invention provides an operational amplifier including a differential input stage (19) and a class AB output stage (20). The differential input stage includes a first input transistor (MP9) having a gate coupled to a first input voltage (Vin+), a source coupled to a tail current source (15), and a drain (12) coupled to a drain of a first current source transistor (MN4) and a source of a first cascode transistor (MN3), and a second input transistor (MP10) having a gate coupled to a second input voltage (Vin−), a source coupled to the tail current source (15), and a drain (11) coupled to a drain of a second current source transistor (MN5) and a source of a second cascode transistor (MN6). The class AB output stage includes a pull-up transistor (MP0) and current mirror circuitry (MP1,MP3,MP4, MP14) coupling a gate of the pull-up transistor (MP0) to a drain of the second cascode transistor (MN6) and a pull-down transistor (MN1) including a gate coupled to a drain of the first cascode transistor (MN3). A first slew boost circuit (13) has an input coupled to the drain (12) of the first input transistor (MP9) and an output coupled to the source (11) of the second cascode transistor (MN6) for amplifying an excess of tail current steered by the first input transistor (MP9) into the input of the first slew boost circuit (13) over a current flowing in the first current source transistor (MN4) and applying the amplified excess to boost the slew rate of the class AB output stage in accordance with a first polarity of the difference between the first (Vin+) and second (Vin−)

input voltages. A second slew boost circuit (14) includes an input coupled to the drain (11) of the second input transistor (MP10) and an output coupled to the source (12) of the first cascode transistor (MN3) for amplifying an excess of tail current steered by the second input transistor (MP10) into the input of the second slew boost circuit (14) over a current flowing in the second current source transistor (MN5) and applying the amplified excess to boost the slew rate of the class AB output stage in accordance with a second polarity of the difference between the first (Vin+) and second (Vin−) input voltages. The first slew boost circuit (13) includes a first current mirror circuit including a first control transistor (MN91) having a source connected to a first reference conductor (GROUND) and a gate and drain coupled to the input of the first slew boost circuit and to a gate of a first current mirror output transistor (MN92) having a source connected to the first reference voltage (GROUND) and a drain coupled to the source of the second cascode transistor (MN6), and wherein the second slew boost circuit (14) includes a second current mirror circuit including a second control transistor (MN0) having a source connected to the first reference voltage (GROUND) and a gate and drain coupled to the input of the second slew boost circuit and to a gate of a second current mirror output transistor (MN2) having a source connected to the first reference voltage (GROUND) and a drain coupled to the source of the first cascode transistor (MN3). The drains of the first (MP9) and second (MP10) input transistors are maintained at a voltage less than a transistor threshold voltage above the first reference voltage (GROUND) except during slewing operation of the operational amplifier.

In another embodiment of the invention, an operational amplifier includes a differential input stage (19A) and a class AB output stage (20A). The differential input stage (19A) includes a first input transistor (MP9) having a gate coupled to a first input voltage (Vin+), a source coupled to a tail current source (15), and a drain (12) coupled to a drain of a first current source transistor (MN4) and a source of a first cascode transistor (MN3), and a second input transistor (MP10) having a gate coupled to a second input voltage (Vin−), a source coupled to the tail current source (15), and a drain (11) coupled to a drain of a second current source transistor (MN5) and a source of a second cascode transistor (MN6). The class AB output stage (20A) includes a pull-up transistor (MP0), a pull-down transistor (MN1), a first bias transistor (MN11) coupled between a gate of the pull-up transistor (MP0) and a gate of the pull-down transistor (MN1), the gate of the pull-down transistor (MN1) being coupled to a drain of the first cascode transistor (MN3). A first slew boost circuit (13A) includes an input coupled to the drain (12) of the first input transistor (MP9) and an output coupled by means of a current mirror coupling circuit (MP18,MP19,MP20,MP21) to the gate of the pull-up transistor (MP0) for amplifying an excess of tail current steered into the input of the first slew boost circuit (13A) over a current flowing in the first current source transistor (MN4) and applying the amplified excess to boost the slew rate of the class AB output stage in accordance with a first polarity of the difference between the first (Vin+) and second (Vin−) input voltages. A second slew boost circuit (14A) includes an input coupled to the drain (11) of the second input transistor (MP10) and an output coupled by means of a cascode coupling transistor (MN18) to the gate of the pull-down transistor (MN1) for amplifying an excess of tail current steered into the input of the second slew boost circuit (14) over a current flowing in the second current source transistor (MN5) and applying the amplified excess to boost the slew rate of the class AB output stage in accordance with a second polarity of the difference between the first (Vin+) and second (Vin−) input voltages. The first slew boost circuit (13A) includes a first current mirror circuit including a first control transistor (MN91) having a source connected to a first reference conductor (GROUND) and a gate and drain coupled to the input of the first slew boost circuit and to a gate of a first current mirror output transistor (MN92) having a source connected to the first reference voltage (GROUND) and a drain coupled to an input of the current mirror coupling circuitry (MP18,MP19,MP20,MP21) and wherein the second slew boost circuit (14A) includes a second current mirror circuit including a second control transistor (MN0) having a source connected to the first reference voltage (GROUND) and a gate and drain coupled to the input of the second slew boost circuit and to a gate of a second current mirror output transistor (MN2) having a source connected to the first reference voltage (GROUND) and a drain coupled to a source of the cascode coupling transistor (MN18). The voltages of the drains of the first (MP9) and second (MP10) input transistors are maintained at a voltage less than a transistor threshold voltage above the first reference voltage (GROUND) except during slewing operation of the operational amplifier.

In the above mentioned embodiments, bipolar transistors can be used instead of MOS transistors, in which case the connections indicated for sources, drains, and gates instead apply to the emitters, collectors, and bases, respectively.

DETAILED DESCRIPTION OF THE PREFERRED EMBODIMENTS

In accordance with the present invention, two current mirrors are added in parallel with the junctions between the drains of the input transistors and the sources of the corresponding cascode transistors of a two stage folded cascode amplifier. During normal operation, the two current mirrors are completely shut off and therefore are "transparent" to the two stage folded cascode amplifier. The two current mirrors also provide current gain to charge and discharge the compensation capacitors to help provide a high slew rate.

The two current mirrors are activated by "excess current" from the input transistors of the input stage caused by a large, rapid transition of the input voltage applied to gates of the input transistors. When the resulting current produced by the input stage exceeds the current of a current source (e.g., transistor MN4 or transistor MN5) in one side of the second stage, the corresponding current mirror turns on proportionally, and therefore drives amplified "excess" current into or out of a compensation capacitor to provide increased slewing speed. The transition between normal operation and slewing operation is stable because the excess slewing current is proportional to the differential input voltage in the transition region.

Figure 3:
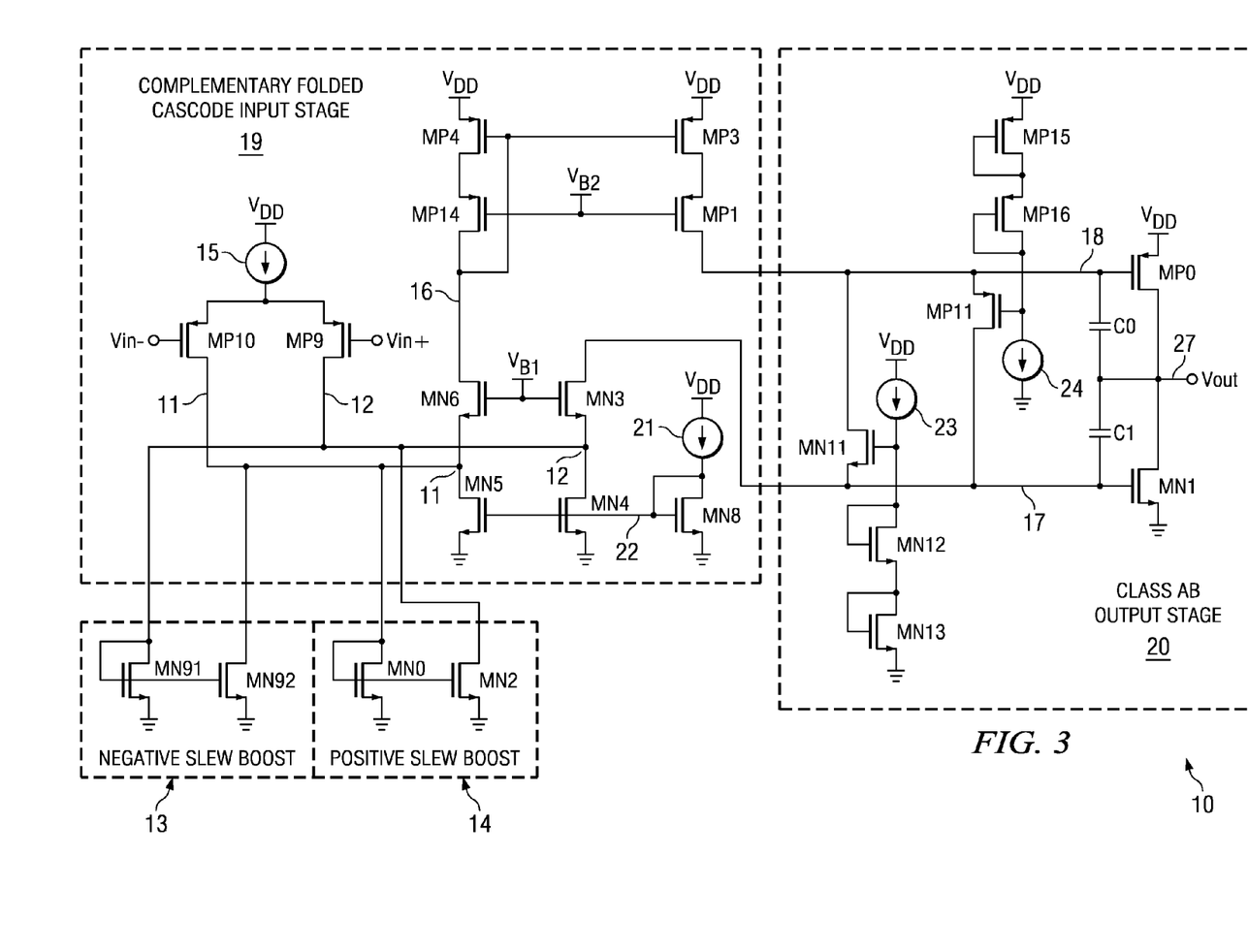
FIG. 3 is a schematic diagram of an operational amplifier similar to that of prior art FIG. 2 and further including slew boost circuitry in accordance with one embodiment of the invention.

Referring to FIG. 3, operational amplifier 10 includes a conventional complementary folded cascode input stage 19 which drives a class AB output stage 20. The input stage 19 includes a pair of P-channel input transistors MP9 and MP10 having their sources connected to a tail current source 15. The gates of input transistors MP9 and MP10 are connected to Vin+ and Vin−. The drain of input transistor MP10 is connected by conductor 11 to the drain of a N-channel current source transistor MN5, the source of which is connected to ground. The drain of input transistor MP9 is connected by conductor 12 to the drain of a N-channel current source transistor MN4, the source of which is connected to ground. The gates of current source transistors MN4 and MN5 are connected by conductor 22 to the gate and drain of a N-channel current mirror control transistor MN8, the source of which is also connected to ground. A current source 21 connected between VDD and conductor 22 supplies a control current through transistor MN8.

The drains of current source transistors MN4 and MN5 are connected to the sources of N-channel cascode transistors MN3 and MN6, respectively. The gates of cascode transistors MN3 and MN6 are connected to a reference voltage VB1. The drain of cascode transistor MN3 is connected by conductor 17 to the gate of N-channel output transistor MN1 of class AB output stage 20.

The drain of cascode transistor MN6 is connected by conductor 16 to the drain of a P-channel cascode transistor MP14 and the gates of P-channel current mirror transistors MP4 and MP3, the sources of which are connected to VDD. The drain of current source transistor MP3 is connected to the source of a P-channel cascode transistor MP1, the drain of which is connected by conductor 18 to the gates of a P-channel output transistor MP0 of class AB output stage 20. The gates of cascode transistors MP1 and MP14 are connected to a reference voltage VB2.

Class AB output stage 20 includes the above-mentioned output transistors MP0 and MN1, the drains of which are connected by conductor 27 to the output terminal on which the output voltage Vout is produced and also to the junction between one terminal of each of compensation capacitors C0 and C1. The source of output transistor MP0 is connected to VDD, and the source of output transistor MN1 is connected to ground. The other terminal of compensation capacitor C0 is connected to conductor 18, and the other terminal of compensation capacitor C1 is connected to conductor 17. Class AB output stage 20 also includes a N-channel transistor MN11 having its source connected to conductor 17 and its drain connected to conductor 18. The gate of transistor MN11 is connected to the junction between a current source 23 and the drain of a N-channel diode-connected transistor MN12. The source of transistor MN12 is connected to the gate and drain of a diode-connected N-channel transistor MN13, the source of which is connected to ground. Current source 23 has another terminal connected to VDD.

Similarly, a P-channel transistor MP11 has its source connected to conductor 18 and its drain connected to conductor 17. The gate of transistor MP11 is connected to the junction between one terminal of a current source 24 and the gate and drain of a P-channel diode-connected transistor MP16. The source of transistor MP16 is connected to the gate and drain of a P-channel diode-connected transistor MP15, the source of which is connected to VDD. Current source 24 has another terminal connected to ground.

Figure 4:
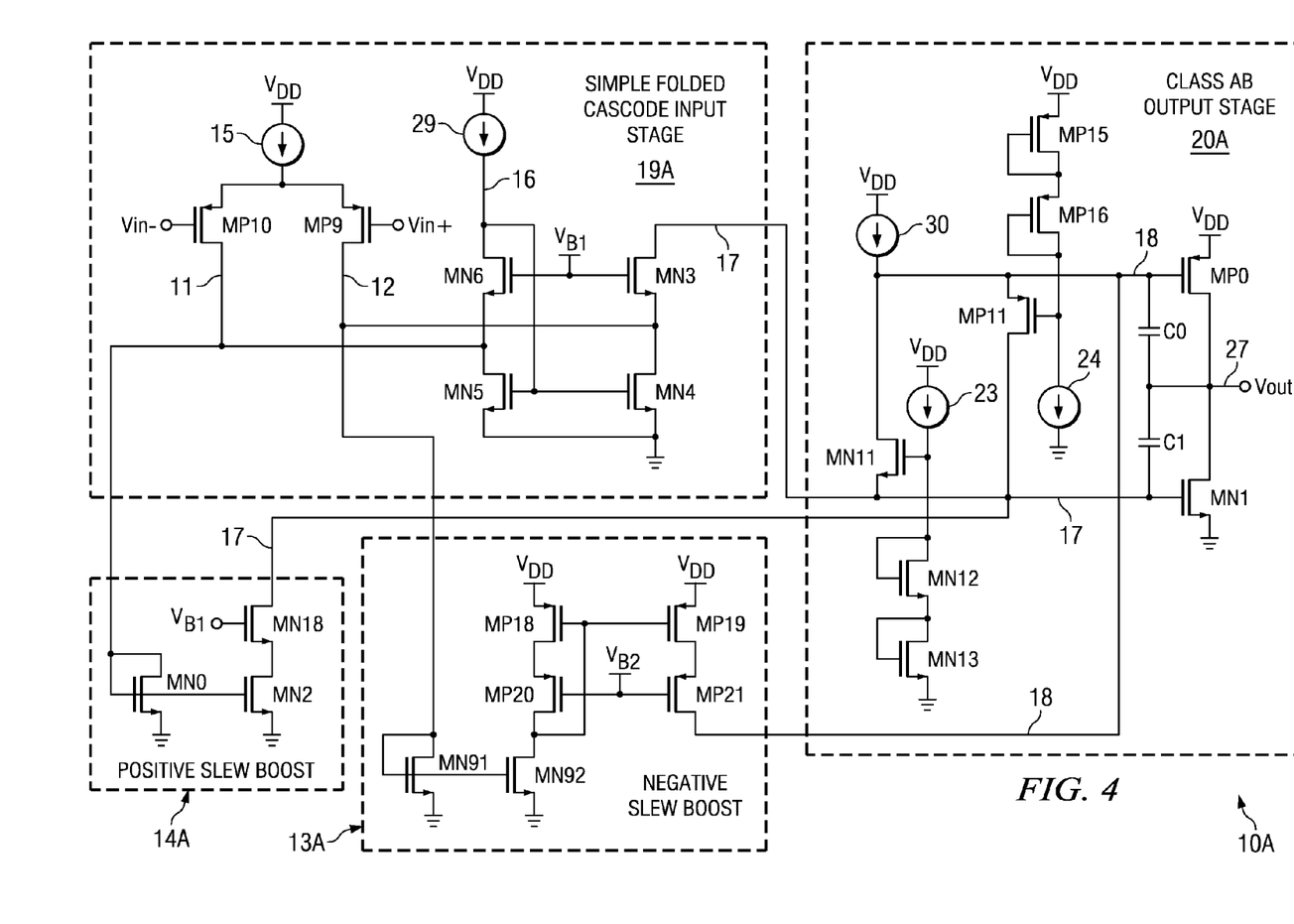
FIG. 4 is a schematic diagram of an operational amplifier similar to that of prior art FIG. 1 and further including slew boost circuitry in accordance with another embodiment of the invention.

The circuitry including transistors MN11, MN12, MN13, MP11, MP15 and MP16 and current sources 23 and 24 operates to maintain a DC bias voltage between conductors 17 and 18 so as to cause essentially the same quiescent current to flow through output transistors MP0 and MN1. It should be understood that the use of the basic Montecelli class AB output stage as shown in FIGS. 3 and 4 is exemplary, but various other class AB output stages also could be used in conjunction with the present invention.

The above described complementary folded-cascode input stage 19 and class AB output stage 20 of FIG. 3 are the same as in prior art FIG. 2. However, in accordance with the present invention, operational amplifier 10 further includes a negative slew boost circuit 13 including a current mirror which includes a diode-connected N-channel transistor MN91 having its source connected to ground and its gate and drain connected to conductor 12 and also to the gate of a N-channel current source transistor MN92 having its source connected to ground and its drain connected to conductor 11. Operational amplifier 10 also includes a positive slew boost circuit 14 including a current mirror that includes a diode-connected N-channel transistor MN0 having its source connected to ground and its gate and drain connected to conductor 11 and also to the gate of a N-channel current source transistor MN2 having its source connected to ground and its drain connected to conductor 12. (The term "negative slew boost" as indicated in block 13 in FIG. 3 refers to boosting the slew rate of Vout on conductor 27 during a negative-going transition of Vout, and similarly, the term "positive slew boost" as indicated in block 13 in FIG. 3 refers to boosting the slew rate of Vout on conductor 27 during a positive-going transition of Vout.)

The magnitude of tail current 15 of complementary folded cascode input stage 19 is larger than the magnitude of the current flowing in either of current source transistors MN4 and MN5. The magnitude of tail current source 15 needs to be greater than the magnitude of the constant currents flowing through current source transistors MN5 and MN4, and also needs to be less than twice the magnitude of that constant current, because otherwise, the steady-state operation would leave cascode transistors MN3 and MN6 with zero current.

Consequently, under input signal overload conditions wherein most or all of tail current 15 is steered through one of input transistors MP9 or MP10 into the drain of one of current source transistors MN5 or MN4, respectively, there will be an "excess" of current over the amount of current that either of transistors MN5 or MN4 is capable of sinking. That excess current will flow through one of diode-connected transistors MN91 or MN0, depending on the polarity of the input signal (Vin=Vin+ minus Vin−) being applied to input stage 19. The excess current is "gained up" by the current mirror of the corresponding one of negative slew boost circuit 13 and positive slew boost circuit 14 in accordance with the ratio of the channel-width-to-channel-length ratio of MN0 to that of MN2 or the ratio of the channel-width-to-channel-length ratio of MN91 to that of MN92. The gained-up result is used as a slew boost current.

To aid in understanding the operation of invention, it may be helpful to understand the operation of the portion of FIG. 3 without the slew boosting function of negative slew boost circuit 13 and positive slew boost circuit 14. If Vin+ undergoes a large positive transition, that steers most or all of the tail current 15 through input transistor MP10 and conductor 11 into the drain of current source transistor MN5. Since the current in current source transistor MN5 is constant, there is a decrease in the amount of current flowing through cascode transistor MN6, conductor 16, and transistors MP14, MP4, MP3 and cascode transistor MP1. This reduces the voltage on conductor 18, turning pull-up transistor MP0 on harder. At the same time, the decreased current in input transistor MP9 causes increased current to flow through cascode transistor MN3, since the current flowing through current source transistor MN4 is constant.

A relatively constant voltage difference is maintained between conductors 17 and 18 as pull-up transistor MP0 is turned on "harder" and pull-down transistor MN1 is turned on "less hard". However, since Vout is increasing while the voltage on conductor 18 is decreasing, compensation capacitor C0 is being discharged while compensation capacitor C1 is being charged. The limited amount of constant current flowing in transistors MN4 and MN5 sharply limits the amount of current available to accomplish the required discharging of compensation capacitor C0 and the required charging of compensation capacitor C1, and therefore also sharply limits the slew rates of class AB output stage 20.

According to the prior art, in order to accomplish a greater slew rate, the channel-width-to-channel-length ratio of transistors MN4 and MN5 must be increased to increase the constant current in each transistor so that more current is available for charging and discharging compensation capacitors C0 and C1 in order to provide faster slew rates. But that substantially increases the operating noise level of prior art folded cascode operational amplifiers.

However, in accordance with the present invention, if Vin+ goes substantially positive relative to Vin− so that the tail current 15 is steered through input transistor MP10, the excess current through transistor MP10 over the constant current in transistor MN5 flows through transistor MN0 of positive slew boost circuit 14 and is gained up by the W/L ratio of MN2 to that of transistor MN0. The gained-up excess current flows through cascode transistor MN3 and, in effect, "re-injects" it with the correct polarity to appropriately charge compensation capacitor C1 and discharge compensation capacitor C0.

The operation is essentially similar if Vin− goes substantially positive relative to Vin+ so that the tail current 15 is steered through transistor MP9 and the excess current flows through transistor MN91 of negative slew boost circuit 13, is gained up by transistor MN92, flows through cascode transistor MN6 and conductor 16, and then is mirrored through cascode transistor MP1 by P-channel current mirror circuitry including transistors MP4 and MP3. The gained-up, mirrored excess current through cascode transistor MP1 is injected into conductor 18 with the correct polarity to appropriately charge compensation capacitor C0 and discharge compensation capacitor C1.

If the amount of amplification of the excess current by slew boost circuits 13 and 14 is increased, the slew rate of operational amplifier 10 will be increased. However, increasing the gain of the slew boost circuits 13 and 14 is equivalent to increasing the gm of the input transistor pair MP9, MP10 during the slewing operation, and the gain margin of the operational amplifier 10 limits the overall amplifier gain to a value that is low enough to avoid circuit instability. Note that the technique of the present invention becomes increasingly effective for input transistors MP9 and MP10 which have low gate-to-drain capacitances.

Note that the various geometry ratios of input transistors MP9 and MP10, current source transistors MN4 and MN5, and cascode transistors MN3 and MN6 should be selected so that the voltages of conductors 11 and 12 are less than one MOS threshold voltage above ground during normal operation, so that slew boost circuits 13 and 14 are completely off except during rapid input voltage transitions that result in a need for positive slewing or negative slewing operation at Vout conductor 27. This prevents slew boost circuits 13 and 14 from contributing any undesirable noise or offset in operational amplifier 10. The constant current flowing through transistors MN4 and MN5 can be relatively small compared to the prior art. The thermal noise contribution of transistors MN4 and MN5 is proportional to their transconductance gm, which is proportional to the constant current flowing through them.

Referring to FIG. 4, another operational amplifier embodiment 10A of the present invention includes a conventional complementary folded cascode input stage 19A which drives a class AB output stage 20A, essentially the same as shown in prior art FIG. 1. Input stage 19A includes P-channel input transistors MP9 and MP10 having their sources connected to tail current source 15. The gates of input transistors MP9 and MP10 are connected to Vin+ and Vin−. The drain of input transistor MP10 is connected by conductor 11 to the drain of—channel current source transistor MN5, the source of which is connected to ground. The drain of input transistor MP9 is connected by conductor 12 to the drain of N-channel current source transistor MN4, the source of which is connected to ground. The gates of current source transistors MN4 and MN5 are connected by conductor 16 to the drain of a N-channel cascode transistor MN6 and one terminal of a current source 29, the other terminal of which is connected to VDD.

The drains of current source transistors MN4 and MN5 are connected to the sources of N-channel cascode transistors MN3 and MN6, respectively. The gates of cascode transistors MN3 and MN6 are connected to a reference voltage VB1. The drain of cascode transistor MN3 is connected by conductor 17 to the gates of output transistor MN1 of class AB output stage 20A.

Class AB output stage 20A of FIG. 4 includes a current source 30 having one terminal connected to conductor 18 and another conductor connected to VDD, and the rest of class AB output stage 20A is identical to output stage 20 of FIG. 3. Note that constant current source 30 in FIG. 4 is replaced in FIG. 3 by transistors MP3, MP4, MP1 and MP14 which constitute a current source that handles both DC current and signal current. The differential input to class AB output stage 20A is advantageous in that it doubles the AC signal current gain into class AB output stage 20 compared to the single ended input class AB output stage 20A in subsequently described FIG. 4.

In accordance with the present invention, operational amplifier 10A of FIG. 4 includes a negative slew boost circuit 13A including a current mirror which includes diode-connected N-channel transistor MN91 having its source connected to ground and its gate and drain connected to conductor 12 and to the gate of a N-channel current source transistor MN92. Transistor MN92 has its source connected to ground. The drain of transistor MN92 is connected to the drain of a P-channel cascode transistor MP20 and to the gates of P-channel current mirror transistors MP18 and MP19, the sources of which are connected to VDD. The drain of current mirror transistor MP18 is connected to the source of cascode transistor MP20. The drain of current mirror transistor MP19 is connected to the source of P-channel cascode transistor MP21. The gates of cascode transistors MP20 and MP21 are connected to a second reference voltage VB2. The drain of cascode transistor MP21 is connected to conductor 18.

Operational amplifier 10A also includes a positive slew boost circuit 14A including a current mirror that includes diode-connected N-channel transistor MN0 having its source connected to ground and its gate and drain connected to conductor 11 and to the gate of N-channel current source transistor MN2 having its source connected to ground and its drain connected the source of a N-channel cascode transistor MN18. The gate of cascode transistor MN18 is connected to VB1 mentioned above. The drain of cascode transistor MN18 is connected to conductor 17.

As explained above with reference to input stage 19 of FIG. 3, the magnitude of the tail current 15 of complementary folded cascode input stage 19A in FIG. 4 is larger than the magnitude of the current flowing in either of current source transistors MN4 and MN5. Consequently, under input signal overload conditions wherein most or all of tail current 15 is steered through one of input transistors MP9 or MP10 into the drain of one of current source transistors MN5 or MN4, respectively, there will be an excess current over the amount of current that either of current source transistors MN5 or MN4 is capable of sinking. That excess current will flow through one of diode-connected transistors MN91 or MN0, depending on the polarity of the input signal (Vin=Vin+ minus Vin−) applied to input stage 19A. That excess current is "gained up" by the current mirror of the corresponding one of negative slew boost circuit 13A and positive slew boost circuit 14A in accordance with the ratio of the channel-width-to-channel-length ratio of MN0 to that of MN2 or the ratio of the channel-width-to-channel-length ratio of MN91 to that of MN92, and the gained-up result is used as a slew boost current.

Thus, instead of using the cross-coupled negative slew boost circuit 13 and positive slew boost circuit 14 of FIG. 3 with their outputs connected to conductors 11 and 12, the negative slew boost circuit 13A of FIG. 4 is coupled to conductor 18 by means of an additional current mirror circuit including P-channel transistors MP18 and MP19 and P-channel cascode transistors MP20 and MP21, and positive slew boost circuit 14A is coupled to conductor 17 by means of additional cascode transistor MN18, so as to feed amplified slew boost currents directly to aid in charging into discharging of compensation capacitors C0 and C1, respectively, during slewing operation. This arrangement allows use of relatively small, fast transistors MN18 and MP21 as slew boost devices.

Figure 5:
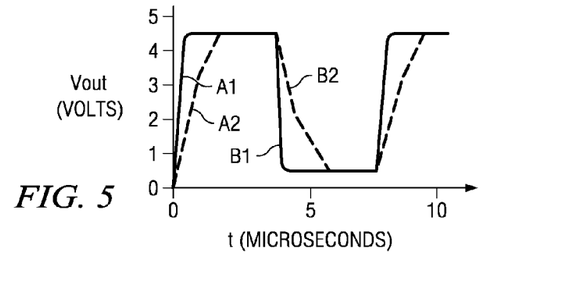
FIG. 5 is a diagram of the output voltage Vout of the described embodiment of the invention for the purpose of comparing the performance of the invention with the performance of the prior art.

The simulated waveforms shown in FIG. 5 illustrate the much faster slew up and slew down rates for the embodiment shown in FIG. 4 than for the prior art, with 8 picofarad values for compensation capacitors C0 and C1. Note that the slew rates are relatively independent of the output capacitance connected to output conductor 27. Specifically, the solid line waveform in FIG. 5 shows a simulated waveform of Vout of the circuit shown in FIG. 4 including the slew boost circuitry of the present invention, and the dashed line waveform in FIG. 5 shows a simulated waveform of Vout of the prior art circuit shown in FIG. 2. Specifically, it can be readily seen that the rise time or slew up time of the rising edge A1 of Vout for the present invention is much faster than the corresponding slew up time for the rising edge A2 of Vout of the same circuit without the slew boost circuitry of the present invention. Also, it can be readily seen that the fall time or slew down time of the falling edge B1 of Vout for the present invention is also much faster than the corresponding slew down time for the falling edge B2 of Vout for the same circuit without the slew boost circuitry of the present invention.

Figure 6:
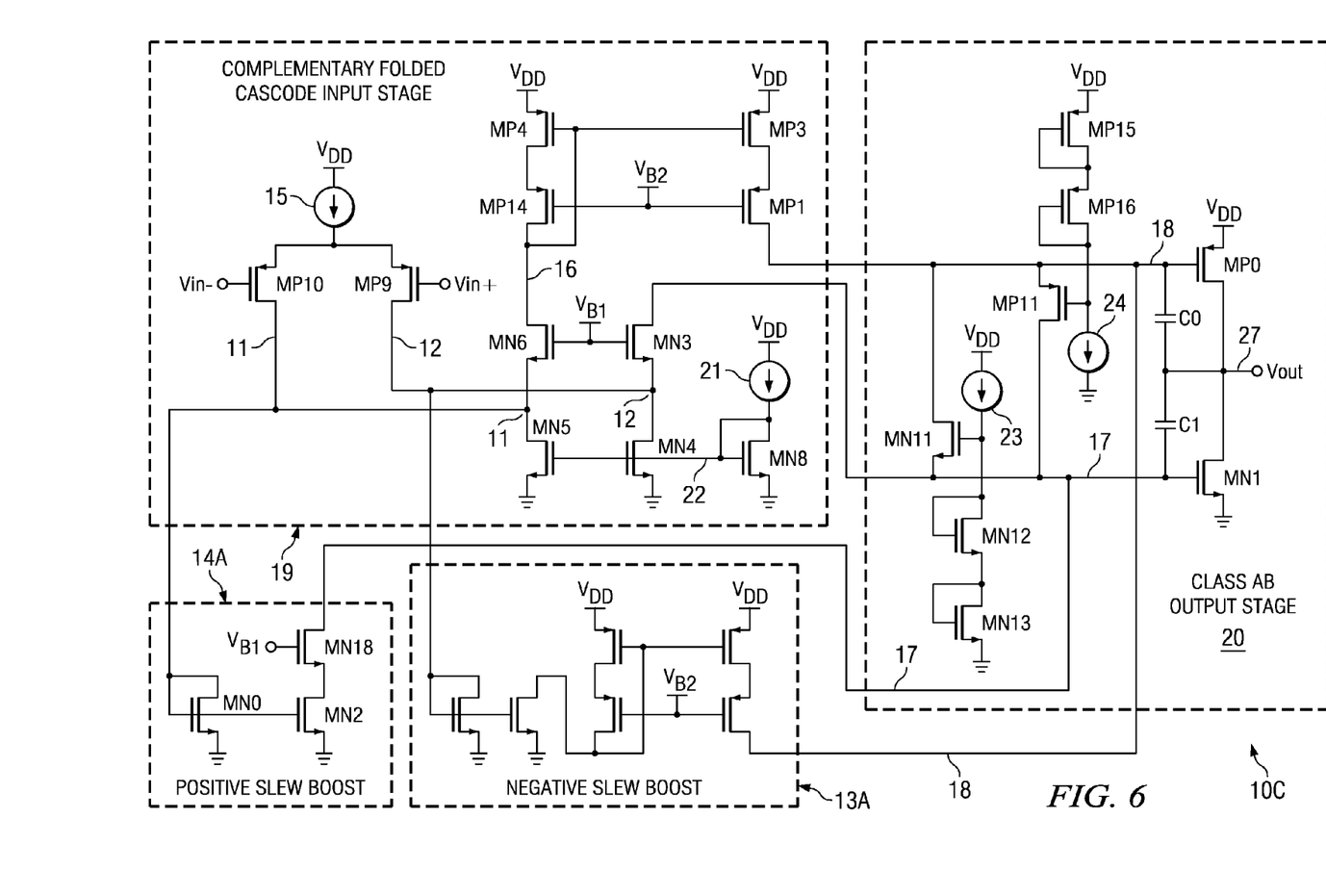
FIG. 6 is a schematic diagram of an operational amplifier similar to that of prior art FIG. 2, and including the slew boost circuitry shown in FIG. 4.

FIG. 6 shows another embodiment of the invention wherein operational amplifier 10C utilizes the same slew boost circuits 13A and 14A shown in FIG. 4 in place of the slew boost circuits 13 and 14, respectively, shown in FIG. 3. In FIG. 3, transistors MP3 and MP4 are relatively large transistors, in order to reduce 1/f noise, and therefore are relatively slow in operation, usually too slow to be effective for use in slew boosting operation. This leads to providing the embodiment of FIG. 6, in which large P-channel current mirror transistors are utilized for signal propagation, and the above described gain boost circuits 13A and 14A are used for slew boosting. Since the transistors used for slew boosting in gain boost circuits 13A and 14A in the embodiment of FIG. 6 are relatively small, no difficult design trade-offs are involved.

Figure 7:
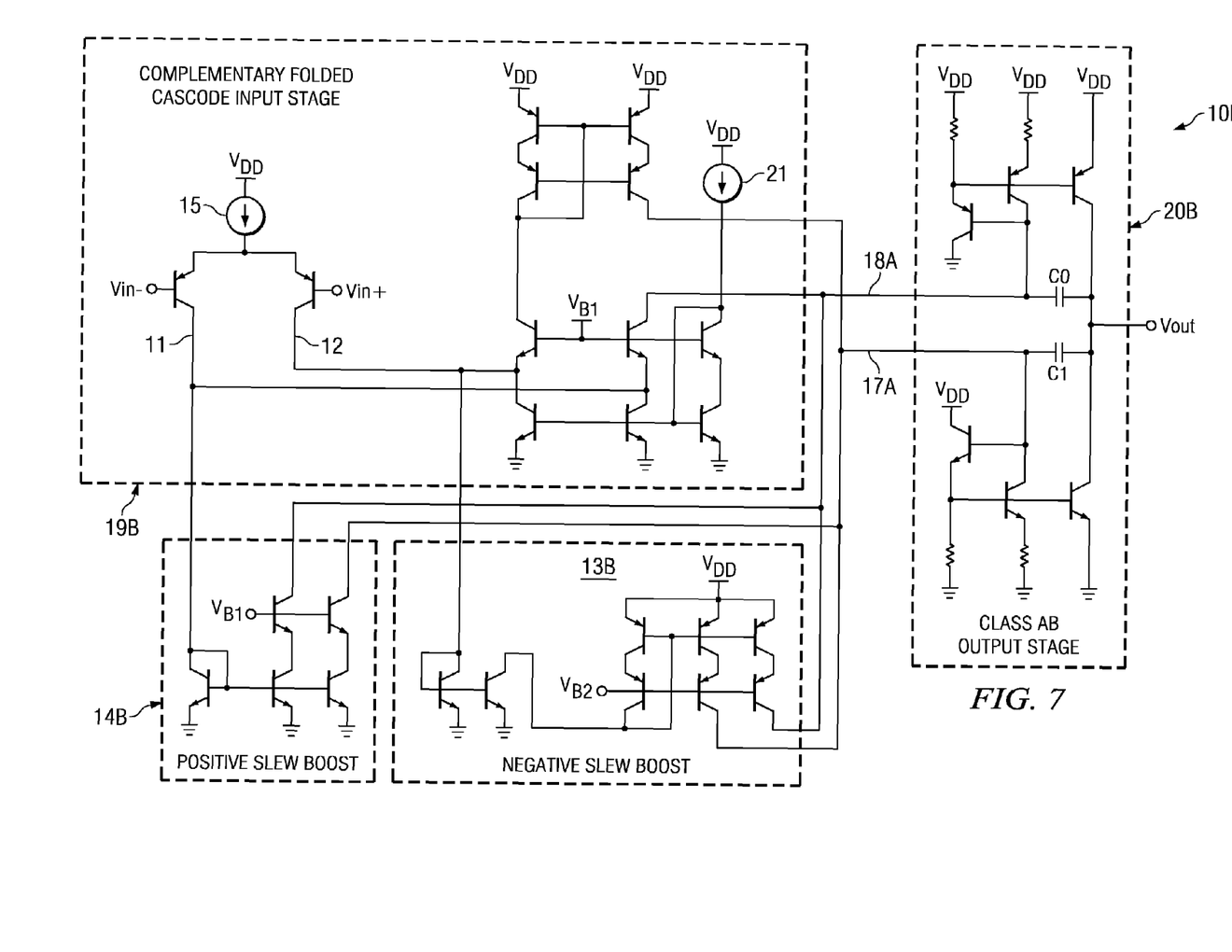
FIG. 7 is schematic diagram of an embodiment of the invention implemented using bipolar transistors rather than field effect transistors to provide a bipolar integrated circuit version of the amplifier shown in FIG. 4.

The above described low noise slew boost techniques can be utilized in amplifiers implemented by means of bipolar transistors instead of MOS field effects transistors. FIG. 7 illustrates such a bipolar integrated circuit amplifier similar to the one shown in FIG. 6. Referring to FIG. 7, complementary folded-cascode input stage 19B is similar to complementary folded cascode input stage 19 at shown in FIG. 6. Negative slew boost circuit 13B is similar to negative slew boost circuit 13A of FIG. 6, and positive slew boost circuit 14B is similar to positive slew boost circuit 14A of FIG. 6. Conductors 17A and 18A of FIG. 7 correspond to conductors 17 and 18, respectively, of FIG. 6. Bipolar class AB output stage 20B is described in commonly assigned U.S. Pat. No. 6,542,032 issued Apr. 1, 2003 to Escobar-Bowser et al.

Note that some folded cascode amplifiers have both a P-channel pair of differentially coupled input transistors and a N-channel pair of input transistors, and that the above described slew boost current mirror circuits could be connected to the drains of the differentially coupled N-channel input transistors as well as the differentially coupled P-channel input transistors.

An advantage of the present invention is that the technique is readily adaptable for use in a wide variety of operational amplifier circuits to greatly improve their slew rates with very little additional circuitry and with very little use of additional circuit chip area and without adversely affecting their operational parameters.

In contrast to the prior art, the described embodiments of present invention have low noise during normal operation, provide lower operating current in the second stage than in the input stage, and can be easily added to existing two-stage folded cascode amplifier designs without modifying the input stages. Also, the two current mirror circuits function to, in effect, provide a clamping voltage for the second stage cascode nodes, which decreases recovery time after a slewing event.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An operational amplifier comprising:
   (a) a differential input stage including
      i. a first input transistor having a gate coupled to a first input voltage, a source connected to a tail current source, and a drain coupled to a drain of a first current source transistor and a source of a first cascode transistor, and
      ii. a second input transistor having a gate connected to a second input voltage, a source coupled to the tail current source, and a drain coupled to a drain of a second current source transistor and a source of a second cascode transistor;
   (b) a class AB output stage including a pull-up transistor and current mirror circuitry connecting a gate of the pull-up transistor to a drain of the second cascode transistor and a pull-down transistor including a gate connected to a drain of the first cascode transistor;
   (c) a first slew boost circuit having an input connected to the drain of the first input transistor and an output connected to the source of the second cascode transistor for amplifying an excess of tail current steered by the first input transistor into the input of the first slew boost circuit over a current flowing in the first current source transistor and applying the amplified excess to boost the slew rate of the class AB output stage in accordance with a first polarity of the difference between the first and second input voltages; and
   (d) a second slew boost circuit having an input connected to the drain of the second input transistor and an output connected to the source of the first cascode transistor for amplifying an excess of tail current steered by the second input transistor into the input of the second slew boost circuit over a current flowing in the second current source transistor and applying the amplified excess to boost the slew rate of the class AB output stage in accordance with a second polarity of the difference between the first and second input voltages;
   (e) the first slew boost circuit including a first current mirror circuit including a first control transistor having a source connected to a first reference conductor and a gate and drain coupled to the input of the first slew boost circuit and to a gate of a first current mirror output transistor having a source connected to the first reference voltage and a drain coupled to the source of the second cascode transistor, and the second slew boost circuit including a second current mirror circuit including a second control transistor having a source connected to the first reference voltage and a gate and drain coupled to the input of the second slew boost circuit and to a gate of a second current mirror output transistor having a source connected to the first reference voltage and a drain coupled to the source of the first cascode transistor;
   (f) the first and second input transistors being N-channel transistors each having a source coupled to a first terminal of a first constant current source and having a second terminal coupled to a second reference voltage.

2. The operational amplifier of claim 1 wherein the first and second current source transistors and the first and second cascode transistors are N-channel transistors.

3. The operational amplifier of claim 1 wherein the pull-up transistor is a P-channel transistor having a source connected to a second reference voltage and a drain connected to an output of the operational amplifier, and wherein the pull-down transistor is an N-channel transistor having a source connected to the first reference voltage and a drain connected to the output of the operational amplifier;
   wherein the current mirror coupling circuitry includes a first P-channel cascode and transistor having a drain connected to the drain of the second cascode transistor and to gates of first and second P-channel current mirror transistors each having a drain connected to the second reference voltage, a drain of the first P-channel cascode transistor being connected to a drain of the first P-channel current mirror transistor, a gate of the first P-channel cascode transistor being connected to a bias voltage and a gate of a second P-channel cascode transistor having a source coupled to a drain of the second P-channel current mirror transistor and a drain connected to the gate of the pull-up transistor.

4. An operational amplifier comprising:
   (a) a differential input stage including
      i. a first input transistor, a first current source transistor, and a first cascode transistor each having first and second electrodes and a control electrode, the control electrode being connected to a first input voltage, the first electrode being connected to a tail current source, and the second electrode being connected the second electrode of the first current source transistor and the first electrode of the first cascode transistor, and
      ii. a second input transistor, a second current source transistor, and a second cascode transistor each having first and second electrodes and a control electrode, the control electrode of the second input transistor being connected to a second input voltage, the first electrode of the second input transistor being connected to the tail current source, the second electrode of the second input transistor being connected to the second electrode of the second current source transistor and the first electrode of the second cascode transistor;
   (b) a class AB output stage including a pull-up transistor and a pull-down transistor each including first and second electrodes and a control electrode, the AB output stage also including a first bias transistor connected between the control electrode of the pull-up transistor and the control electrode of the pull-down transistor, the control electrode of the pull-down transistor being connected to the second electrode of the first cascode transistor;
   (c) a first slew boost circuit having an input connected to the second electrode of the first input transistor and an output connected by means of a current mirror connecting circuit to the control electrode of the pull-up transistor for amplifying an excess of tail current steered into the input of the first slew boost circuit over a current flowing in the first current source transistor and applying the amplified excess to boost the slew rate of the class AB output stage in accordance with a first polarity of the difference between the first and second input voltages; and
   (d) a second slew boost circuit having an input connected to the second electrode of the second input transistor and an output connected by means of a cascode connecting transistor to the control electrode of the pull-down transistor for amplifying an excess of tail current steered into the input of the second slew boost circuit over a current flowing in the second current source transistor and applying the amplified excess to boost the slew rate of the class AB output stage in accordance with a second polarity of the difference between the first and second input voltages.

5. The operational amplifier of claim 4 wherein each control electrode is a base, each first electrode is an emitter, and each second electrode is a collector.

6. An operational amplifier comprising:
(a) a differential input stage including
  i. a first input transistor having a gate coupled to a first input voltage, a source connected to a tail current source, and a drain coupled to a drain of a first current source transistor and a source of a first cascode transistor, and
  ii. a second input transistor having a gate coupled to a second input voltage, a source connected to the tail current source, and a drain coupled to a drain of a second current source transistor and a source of a second cascode transistor;
(b) a class AB output stage including a pull-up transistor, a pull-down transistor, a first bias transistor connected between a gate of the pull-up transistor and a gate of the pull-down transistor, the gate of the pull-down transistor being connected to a drain of the first cascode transistor;
(c) a first slew boost circuit having an input connected to the drain of the first input transistor and an output connected by means of a current mirror connecting circuit to the gate of the pull-up transistor for amplifying an excess of tail current steered into the input of the first slew boost circuit over a current flowing in the first current source transistor and applying the amplified excess to boost the slew rate of the class AB output stage in accordance with a first polarity of the difference between the first and second input voltages; and
(d) a second slew boost circuit having an input coupled to the drain of the second input transistor and an output connected by means of a cascade connecting transistor to the gate of the pull-down transistor for amplifying an excess of tail current steered into the input of the second slew boost circuit over a current flowing in the second current source transistor and applying the amplified excess to boost the slew rate of the class AB output stage in accordance with a second polarity of the difference between the first and second input voltages.

7. The operational amplifier of claim 6 wherein the first slew boost circuit includes a first current mirror circuit including a first control transistor having a source connected to a first reference conductor and a gate and drain coupled to the input of the first slew boost circuit and to a gate of a first current mirror output transistor having a source connected to the first reference voltage and a drain coupled to an input of the current mirror connecting circuitry and wherein the second slew boost circuit includes a second current mirror circuit including a second control transistor having a source connected to the first reference voltage and a gate and drain connected to the input of the second slew boost circuit and to a gate of a second current mirror output transistor having a source connected to the first reference voltage and a drain coupled to a source of the cascode coupling transistor.

8. The operational amplifier of claim 7 wherein the first and second input transistors are N-channel transistors each having a source coupled to a first terminal of a first constant current source having a second terminal coupled to a second reference voltage.

9. The operational amplifier of claim 8 wherein the first and second current source transistors and the first and second cascode transistors are N-channel transistors.

10. The operational amplifier of claim 7 wherein the pull-up transistor is a P-channel transistor having a source connected to a second reference voltage and a drain connected to an output of the operational amplifier, and wherein the pull-down transistor is an N-channel transistor having a source connected to the first reference voltage and a drain connected to the output of the operational amplifier.

11. The operational amplifier of claim 7 wherein voltages of the drains of the first and second input transistors are maintained at a voltage less than one transistor threshold voltage above the first reference voltage except during slewing operation of the operational amplifier.

12. The operational amplifier of claim 7 wherein gains of the first and second current mirror circuits during slewing operation are sufficiently low to avoid instability of the operational amplifier during the slewing operation.

* * * * *